United States Patent
Markulic et al.

(10) Patent No.: US 11,637,554 B2
(45) Date of Patent: Apr. 25, 2023

(54) DEVICE AND METHOD FOR ENHANCING VOLTAGE REGULATION PERFORMANCE

(71) Applicant: IMEC VZW, Leuven (BE)

(72) Inventors: Nereo Markulic, Etterbeek (BE); Benjamin Hershberg, Leuven (BE); Jorge Luis Lagos Benites, Heverlee (BE); Ewout Martens, Heverlee (BE); Jan Craninckx, Boutersem (BE)

(73) Assignee: IMEC VZW, Leuven (BE)

( * ) Notice: Subject to any disclaimer, the term of this patent is extended or adjusted under 35 U.S.C. 154(b) by 79 days.

(21) Appl. No.: 17/123,299

(22) Filed: Dec. 16, 2020

(65) Prior Publication Data

US 2021/0181775 A1 Jun. 17, 2021

(30) Foreign Application Priority Data

Dec. 17, 2019 (EP) .................................... 19216852

(51) Int. Cl.
*H03K 19/0175* (2006.01)
*H03M 1/66* (2006.01)

(52) U.S. Cl.
CPC ...... *H03K 19/017509* (2013.01); *H03M 1/66* (2013.01)

(58) Field of Classification Search
CPC ............ H03K 19/017509; H03M 1/66; H03M 1/462; H03M 1/466; H03M 1/0863; H03M 1/167; G05F 1/618; H03F 2203/45514; H03F 2203/45551; H03F 1/303; H03F 3/005; H03F 3/265; H03F 3/45269; H03F 3/45475
See application file for complete search history.

(56) References Cited

U.S. PATENT DOCUMENTS

| | | | |
|---|---|---|---|
| 6,031,362 A | 2/2000 | Bradley | |
| 7,319,314 B1 | 1/2008 | Maheshwari et al. | |
| 2010/0321059 A1* | 12/2010 | Nakatsu | H03K 19/017509 326/30 |
| 2011/0001518 A1* | 1/2011 | Debnath | G11C 27/024 327/96 |
| 2012/0153910 A1* | 6/2012 | Bulzacchelli | G05F 1/575 323/272 |
| 2015/0091647 A1* | 4/2015 | Kumar | H03F 3/45179 330/257 |
| 2018/0152174 A1* | 5/2018 | Zanbaghi | G11C 27/024 |

OTHER PUBLICATIONS

Extended European Search Report and Written Opinion, EP Application No. 19216852.4, dated Jun. 9, 2020, 14 pages.

* cited by examiner

*Primary Examiner* — John W Poos
*Assistant Examiner* — Tyler J Pereny
(74) *Attorney, Agent, or Firm* — McDonnell Boehnen Hulbert & Berghoff LLP

(57) ABSTRACT

A device for buffering a reference signal comprises a regulator circuit configured to generate at least two replicas of the reference signal as regulated output signals. The device further comprises a receiving circuit configured to receive the regulated output signals in a switchable manner. In this context, the regulated output signals are configured to have different performance characteristics.

14 Claims, 15 Drawing Sheets

DEVICE AND METHOD FOR ENHANCING VOLTAGE REGULATION PERFORMANCE

CROSS-REFERENCE TO RELATED APPLICATIONS

The present application is a non-provisional patent application claiming priority to European Patent Application No. 19216852.4, Dec. 17, 2019, the contents of which are hereby incorporated by reference.

FIELD OF THE DISCLOSURE

This application relates to circuitry. In particular, this application relates to circuitry having multiple regulated outputs that replicate a reference signal to facilitate performance of voltage regulation in electronic circuits and systems.

BACKGROUND

Voltage regulation is a widely utilized technique in electronic circuits and systems. Generally, the power consumption of a voltage regulator depends on the particular needs of the load that it is providing charge to or absorbing charge from. Each loading circuit has its own charge or discharge profile across both frequency and time, and also has its own accuracy requirements for how close to ideal the regulated voltage must be in order to minimize the influence of error on overall circuit performance.

In analog and mixed-signal circuits, the loading circuit is often very complex and it can be difficult to predict the instantaneous current draw of the loading circuit at any particular moment in time. Therefore, the voltage regulator must be designed such that at any moment in time, the voltage regulator will have enough bandwidth and current sourcing capability to track changes in the load and to keep the regulated voltage within required reference ripple bounds. This ultimately manifests as a tradeoff in the total power consumption and overall power efficiency of the voltage regulator.

For example, U.S. Pat. No. 6,031,362 A is directed to a technique for optimizing the power consumption of low drop out (LDO) linear voltage regulators by optimizing the output voltage of a switch mode power supply (SMPS). The optimization is performed by using feedback to control the output voltage of the SMPS that is used as the input voltage to subsequent LDO regulators. A multiplexer and an analog to digital converter (ADC) are used to successively sample the output voltages of multiple parallel LDO regulators. The digitized voltage values are then inputted to a digital processor that compares the LDO regulator output voltages with acceptable limits previously stored in memory.

However, such circuitry is relatively complex and costly. Moreover, the overall power efficiency associated with a single LDO regulator or multiple parallel LDO regulators that provide one or more regulated voltages to a load cannot be easily determined.

SUMMARY

Accordingly, an aspect of the application is to provide a device and a method for enhancing the performance of voltage regulation in a simple and cost-effective manner, and in a way that optimizes the tradeoff between power consumption and overall power efficiency associated with voltage regulation, in particular with respect to the accuracy requirements of the load circuit.

According to a first aspect, a device for buffering a reference signal is provided. The device comprises a regulator circuit configured to generate at least two replicas of the reference signal as regulated output signals. The device further comprises a receiving circuit configured to receive the regulated output signals in a switchable manner. In this context, the regulated output signals are configured to have different performance characteristics.

Therefore, the regulator circuit generates two or more replicas of the input reference signal, e.g., voltage, as regulated output voltages. The regulated output voltages are defined in terms of, for instance, accuracy, output impedance, bandwidth, etc. The receiving circuit utilizes these multiple copies to reduce the total power consumption of the regulator circuit. Moreover, the regulated output signals are consistent with each other, especially with respect to their average output voltages. Effective voltage regulation can be performed, especially in terms of reference regulation.

In a first implementation of the first aspect, the regulator circuit comprises a plurality of regulator sub-blocks wherein each regulator sub-block is configured to generate a respective regulated output signal. In this context, the plurality of regulator sub-blocks are further configured to generate the regulated output signals independently. Hence, the performance of each regulated replica can be independently defined, especially in terms of specifications of accuracy, output impedance, bandwidth, etc.

Furthermore, the plurality of regulator sub-blocks have different regulator topologies and/or are designed to meet different performance specifications and, therefore, have different performance characteristics. The performance of each regulated replica can be independently defined in terms of the particular regulator block that is used to meet the specifications of the regulated replica.

In a second implementation of the first aspect, each regulator sub-block comprises a clocked comparator, a charge reservoir and a charge source/sink circuitry, whereby the clocked comparator is configured to compare the regulated output signal to the reference signal. The simplified implementation of each regulator block allows for a cost-effective but enhanced voltage regulation performance.

In a further implementation of the first aspect, the regulator sub-block is further configured to perform charge sharing operation between the charge reservoir and the charge source/sink circuitry. In other words, charge can either be added or subtracted from the charge reservoir to minimize the difference between the reference input voltage or the ideal output voltage and the regulated output voltage.

In a further implementation of the first aspect, the regulator sub-block further comprises a variable resistor configured to define charging and/or discharging of the charge reservoir. In addition to this, or as an alternative, the variable resistor can be implemented as a switched capacitor resistor, which has an equivalent resistance value inversely proportional to its capacitor value and its clock frequency.

In a further implementation of the first aspect, the regulator circuit is further configured to receive a plurality of reference signals and the regulator circuit is configured to generate at least two replicas of all or some of the reference signals as regulated output signals. This facilitates flexible circuit implementation, particularly in terms of the loading circuit implementation.

In a further implementation of the first aspect, the receiving circuit comprises switching circuitry configured to switch from one regulated output signal to another in a non-overlapping manner. The receiving circuit supports switching from one regulated replica to another.

In a further implementation of the first aspect, the receiving circuit is a discrete-time switched-capacitor signal processing circuit and the regulator circuit is configured to function as a reference regulator for the signal processing circuit. The receiving circuit can be further referred to as a signal conversion circuit, for instance, an analog-to-digital converter (ADC) circuit. The regulator circuit is configured to deliver reference voltages that are used to provide an absolute measure of voltage amplitudes in signal conversion.

In a further implementation of the first aspect, the receiving circuit further comprises a detector circuit configured to provide control signals to the switching circuit to control the switching circuit to switch from one regulated output signal to another regulated output signal at an optimal time at which the desired performance characteristic of the regulated output signal changes. In this context, the detector circuit is further configured to produce a slew-done signal to indicate that the receiving circuit should stop slewing and commence settling behavior. This facilitates optimal or near-optimal switching of the switching circuit between the regulated replicas.

In a further implementation of the first aspect, the detector circuit is further configured to sense a delayed version of a trigger signal at which the receiving circuit starts its operation. This facilitates implementation of a further simplified switching criteria.

In a further implementation of the first aspect, one of the at least two replicas of the reference signal is configured to have high speed and low accuracy characteristics thereby generating a first regulated output signal and the other reference signal is configured to have low speed, high accuracy characteristics thereby generating a second regulated output signal. In this context, the receiving circuit is configured to utilize the first regulated output signal and the second regulated output signal successively. The device allows for a tradeoff between the overall power efficiency of voltage regulation and the accuracy requirements of the load circuit.

According to a second aspect, a method for buffering a reference signal is provided. The method comprises generating at least two replicas of the reference signal as regulated output signals and receiving the regulated output signals in a switchable manner. In this context, the regulated output signals are defined with different performance characteristics. This facilitate reducing the total power consumption required for voltage regulation in a simplified manner.

In a first implementation of the second aspect, the method further comprises generating the regulated output signals independently. The performance of each regulated replica can be independently defined/configured, especially in terms characteristics such accuracy, output impedance, bandwidth, etc.

In a second implementation of the second aspect, the method further comprises receiving a plurality of reference signals and generating two or more replicas of all or some of the reference signals as regulated output signals. This facilitates flexible circuit implementation, particularly in terms of the loading circuit implementation.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
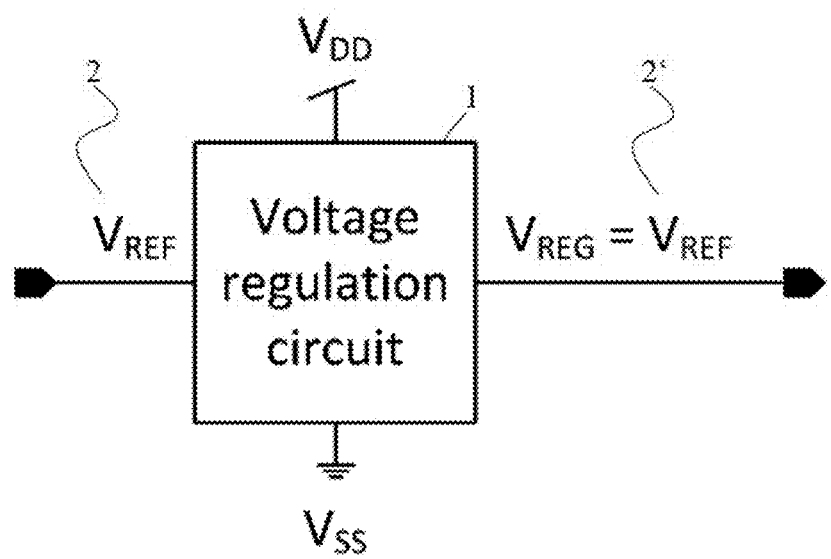
FIG. 1 illustrates a generalized voltage regulation circuit, according to an example embodiment.

FIG. 1 illustrates an example of a voltage regulation circuit 1. An input of the voltage regulation circuit 1 is coupled to a reference voltage 2 having an arbitrary impedance (e.g., $V_{REF}$). The voltage regulation circuit 1 is configured to output a regulated voltage 2' (e.g., $V_{REG}$) that substantially equals the input voltage. The output impedance of the voltage regulation circuit 1 is configured to facilitate communicating the regulated voltage 2' to receiving circuits downstream of the voltage regulation circuit 1. It is typically desirable for the regulated output voltage 2' to have a low output impedance across a wide bandwidth, so that the voltage regulation circuit 1 can simultaneously source current to the connected circuits that pull charge from $V_{REG}$ and maintain stable and accurate matching of voltages $V_{REF}$ and $V_{REG}$. Any deviation from this equality results in an inaccurate reproduction of $V_{REF}$ and constitutes a source of error (e.g., reference noise, reference ripple, reference error, etc.) for the connected circuits. An ideal voltage regulation circuit 1 is therefore a voltage source with zero output impedance across infinite bandwidth.

The purpose of the voltage regulation circuit 1 is very broad, and encompasses both supply regulation and reference regulation. Supply regulation generally refers to the case where $V_{REG}$ serves as a power supply for analog and/or digital circuits. Reference regulation generally refers to the case where $V_{REG}$ serves as a reference voltage that is used to provide an absolute measure of voltage amplitude in an analog and/or mixed-signal circuit. For example, a voltage reference is used in an analog to digital (ADC) or digital to analog (DAC) circuit to define the full-scale voltage range against which all sampled input (for ADC) or output (for DAC) voltages are quantized with respect to.

Figure 2:
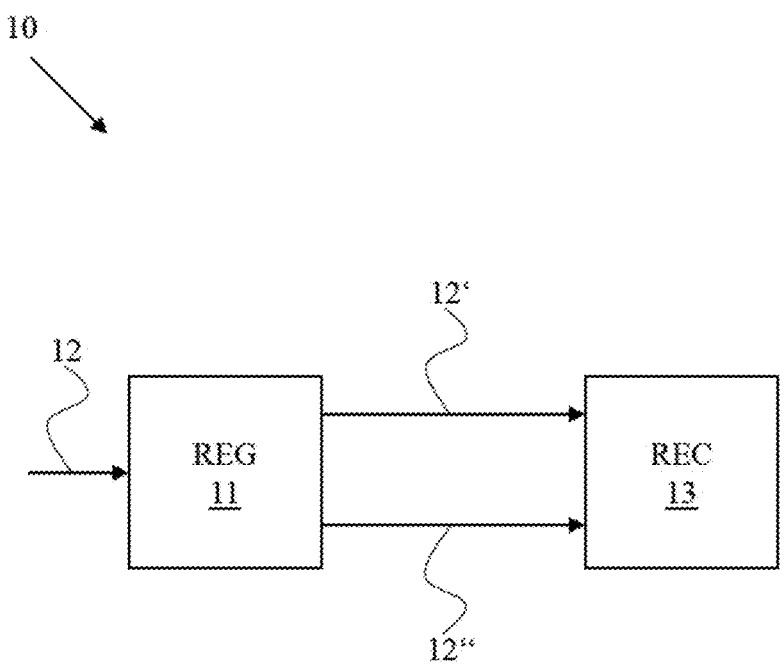
FIG. 2 illustrates a device for buffering a reference signal, according to an example embodiment.

FIG. 2 illustrates an embodiment of a device 10 according to the first aspect. In particular, a simplified form of the proposed solution is illustrated herein in a block diagram. The device 10 comprises a regulator circuit 11 that generates two replicas of an input reference signal 12 or reference voltage (e.g., $V_{REF}$) as regulated output voltages (12' and 12") (e.g., $V_{REG1}$, $V_{REG2}$). The device 10 further comprises a receiving circuit 13 that receives the regulated replicas (12' and 12") in a switchable manner. The regulated replicas (12' and 12") are configured to have different performance characteristics in terms of accuracy, output impedance, bandwidth, and so on, and, therefore, the receiving circuit 13 can utilize these replicas (12' and 12") to reduce the performance requirements for the regulator circuit 11.

In addition, the performance of each regulated replica (12' and 12") can be independently configured to have different performance characteristics in terms of accuracy, output impedance, bandwidth, etc. For instance, one regulated replica 12' may correspond to the regulated replica of the reference voltage 12 with low accuracy, while the other regulated replica 12" may correspond to the regulated replica of the reference voltage 12 with high accuracy. Although only two regulated replicas (12' and 12") are illustrated herein, it is possible to generate more than two regulated replicas of the reference voltage 12 if needed by the receiving circuit 13.

Furthermore, the performance of each regulated replica (12' and 12") can be independently defined in terms of the particular regulator circuit that is used to meet these specifications. For example, there are power efficient regulator topologies that can provide a large bandwidth, but suffer from low accuracy. On the other hand, it is also possible to build an efficient regulator that can provide high accuracy, but which suffers from low bandwidth. In order to build a regulator that is both high accuracy and high bandwidth, the power efficiency will be significantly worse than either of the two aforementioned cases.

With the feasibility of generating two regulated replicas (12' and 12") of the reference voltage 12, the regulator circuit 11 facilitates decoupling these two opposing design constraints (e.g., accuracy and bandwidth) and utilizes two or more high-efficiency regulator topologies, each optimized differently for a certain level of performance with respect to accuracy, bandwidth, peak current delivery, etc.

Moreover, many forms of the receiving circuit 13, e.g., signal conversion circuits, operate with a high degree of orthogonality with respect to accuracy and bandwidth (i.e., output impedance). In other words, many practical signal processing circuits only require either accuracy or low output impedance (i.e., bandwidth) from the regulated reference or supply at any particular instant of time, but not both at the same time. This happens if the circuit does not need high accuracy when it is pulling relatively large amounts of current from the reference or supply and rather only needs high accuracy at moments in time when it is pulling relatively small amounts of current from the reference or supply. This is often the case in any system that uses residue amplifiers to settle to a solution, such as in a multiplying digital to analog converter (MDAC) of a pipelined analog to digital converter (ADC). This is also often the case in any system that uses charge-redistribution DACs to perform an iterative search, such as in a successive approximation (SAR) ADC.

Figure 3A:
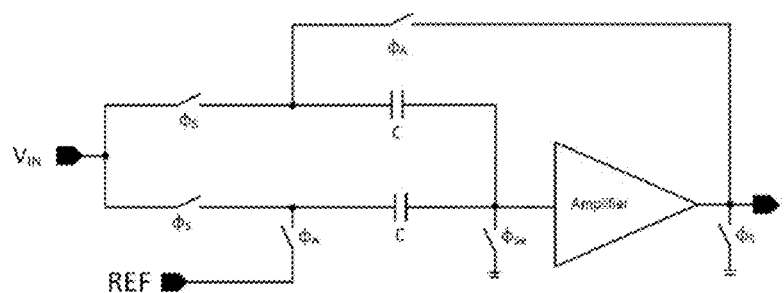
FIG. 3A illustrates a multiplying digital to analog converter (MDAC) operating in two phases, according to an example embodiment.
Figure 3B:
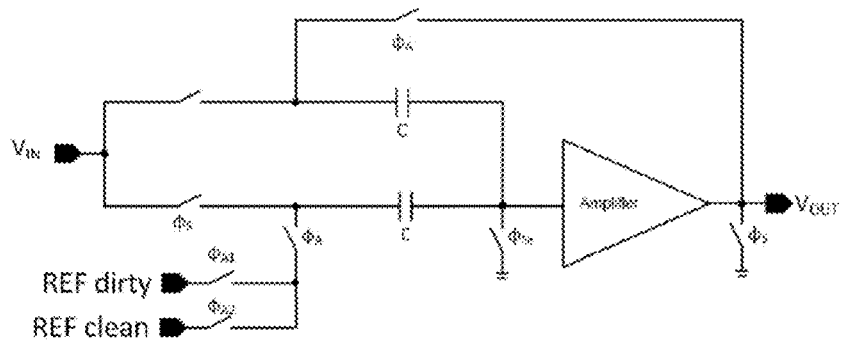
FIG. 3B illustrates a reference arrangement for the MDAC, according to an example embodiment.
Figure 3C:
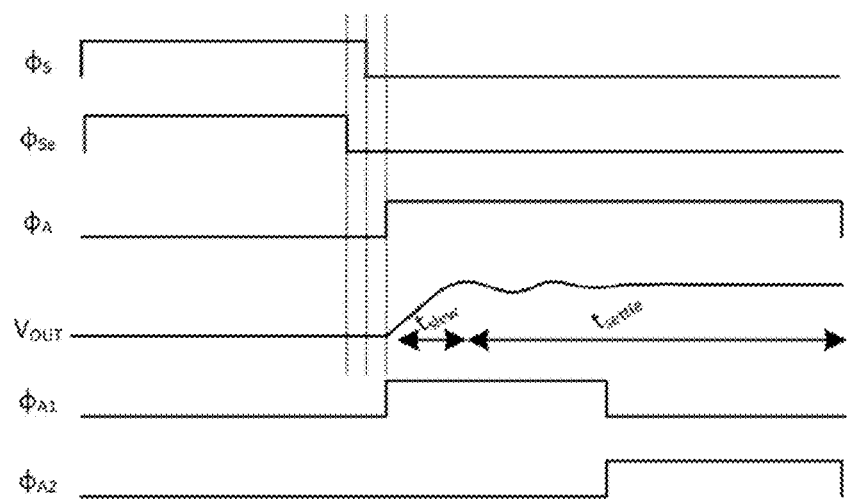
FIG. 3C illustrates the timing operation of the MDAC, according to an example embodiment.

An example of such a switched-capacitor circuit is illustrated in FIGS. 3A-3C in the context of a MDAC. FIG. 3A illustrates a MDAC that operates in two phases $\phi_S$ ($\phi_{Se}$) and $\phi_A$, which are further illustrated in FIG. 3C. The input, $V_{IN}$, is sampled in the first phase, $\phi_S$, where it is to be noted that $\phi_{Se}$ ensures reliable early sampling. In the second phase, $\phi_A$, the difference between the reference REF, and the sampled input $V_{IN}$ is amplified. It can be realized from FIG. 3C that the amplifier output changes fast initially during $\phi_A$ (time frame indicated by $t_{slew}$). The output of the amplifier settles afterwards during some time indicated by $t_{settle}$.

It is further important to note that in such an arrangement, a substantial initial charge can be pulled fast from the reference REF during $t_{slew}$. The amplifier changes its output significantly in this time frame. During settling $t_{settle}$, less charge is pulled from the reference since the output of the amplifier mostly stabilizes around a final potential. At the end of the amplification phase, the following stage (not shown) samples the amplifier output. A precise sample is often required. The two distinct phases of amplification impose significantly different requirements on the reference REF. Initially at or during $t_{slew}$, it is necessary to pull charge fast, where precision is less of a concern. Throughout $t_{settle}$, there is little charge pull from the reference REF, but the voltage needs to be accurate (i.e., for precise sampling in the following stage).

FIG. 3B illustrates an arrangement of references by which these orthogonal properties can be exploited. This is achieved by separating the reference REF into REF_dirty and REF_clean that on average provide the same voltage. The regulation for REF_dirty, however, needs to be fast (i.e., characterized as having a large bandwidth) and does not require precision. The regulation of REF_clean needs to be accurate but does not require large bandwidth (i.e., characterized as being high speed).

Figure 4:
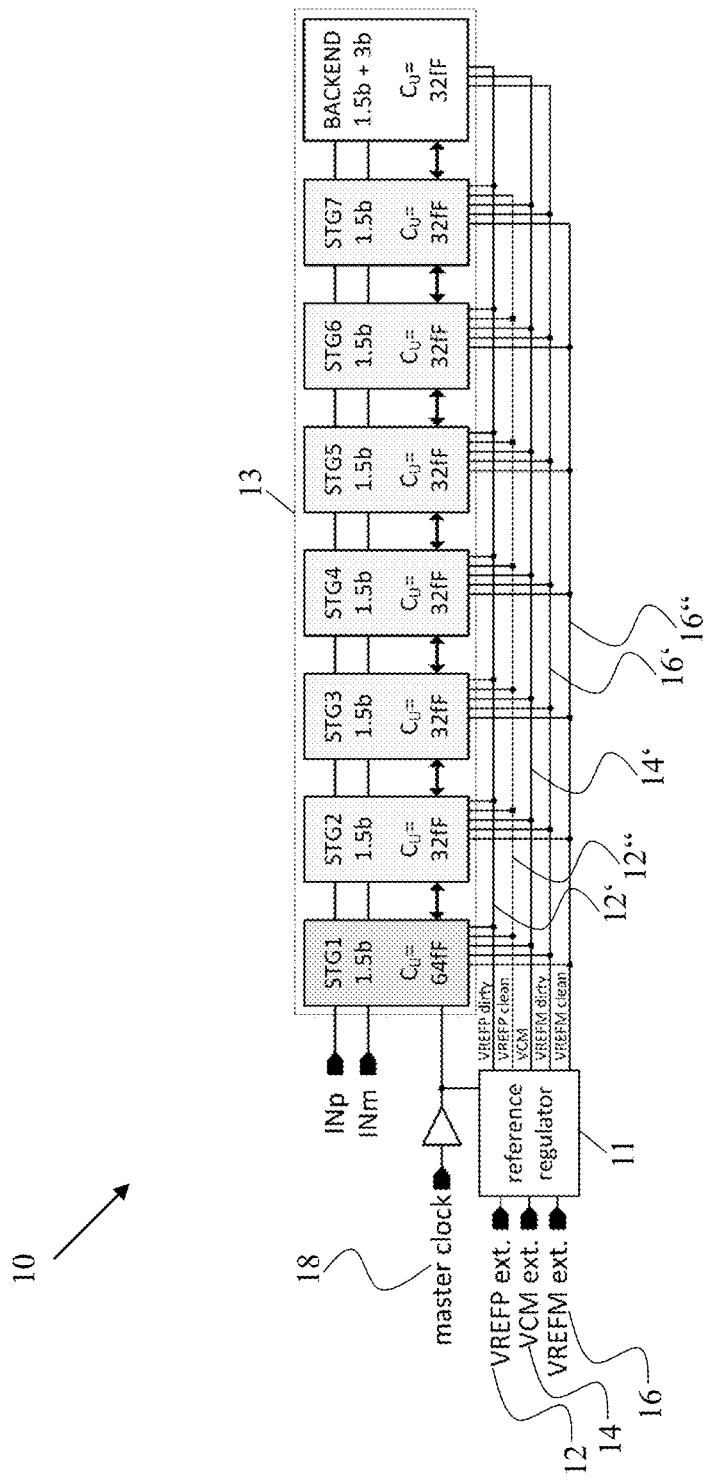
FIG. 4 illustrates a detailed view of a device for buffering a reference signal, according to an example embodiment.

FIG. 4 illustrates a detailed view of the device 10 according to the first aspect. The regulator circuit 11 is implemented as a reference regulator and the receiving circuit 13 is implemented as a pipelined ADC. The pipelined ADC has multiple stages that typically contain a sub-ADC and a multiplying digital to analog converter (MDAC), followed by a staged backend. The ADC inputs, INp, INm are connected to the first stage, STG1, that is cascaded to the second stage, STG2, that is cascaded to the third stage, STG3, that is further cascaded to the fourth stage, STG4, that is further cascaded to the fifth stage, STG5, that is further cascaded to the sixth stage, STG6, that is moreover cascaded to the seventh stage, STG7, and eventually terminated at the backend. Although a total of seven stages are illustrated herein, it is to be understood that the number of stages is not limited by this example and other examples could include fewer or more stages.

Each stage (STG1-STG7) of the pipelined ADC is realized by a sub-ADC and a MDAC circuit, for example, a 1.5b-flip-around MDAC circuit. Each MDAC circuit (from every stage (STG1-STG7)) can be individually treated as the receiving circuit 13 as well as the whole ADC where the MDAC circuits are operating collectively. The receiving circuit 13 is further implemented in such a way that it has fully dynamic power consumption with constant energy per conversion independent of the master clock rate of the master clock 18.

The regulator circuit 11 is configured to receive multiple reference inputs (12, 14, and 16), and thereby generates regulated replicas of all or some of the reference inputs (12, 14, and 16). The receiving circuit 13 herein is implemented as a pipelined ADC, and requires three references: two complementary references VREFP, VREFM and a common-mode reference VCM. However, only the references VREFP and VREFM are needed to be regulated with regard to high accuracy requirements, and hence the regulator circuit 11 generates two regulated replicas (12', 12", 16', and 16") for each of the references (12 and 16). Whereas the reference VCM has fixed accuracy requirements, and, therefore, a single regulated voltage 14' is generated by the regulator circuit 11 with regard to the reference 14. The regulated replicas (12', 12", 16' and 16") are respectively defined as dirty reference and clean reference, which relates to their performance characteristics, e.g., low accuracy and high accuracy.

Figure 5:
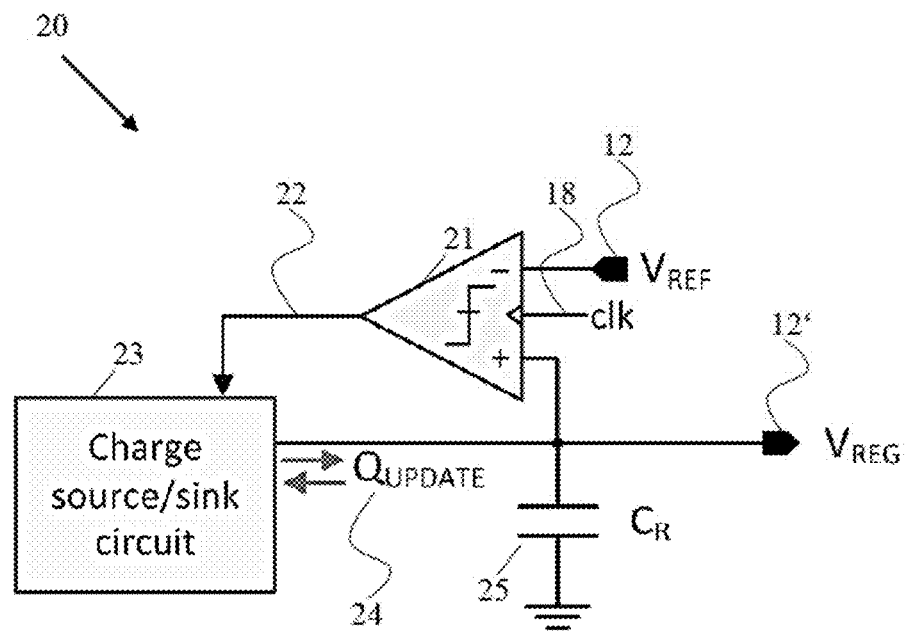
FIG. 5 illustrates a simplified view of a regulator circuit of the device for buffering the reference signal, according to an example embodiment

FIG. 5 illustrates a simplified view of a regulator block 20 according to the first aspect. As mentioned above, the receiving circuit 13 is implemented with dynamic power consumption through constant energy per conversion independent of the master clock rate of the master clock 18. To preserve this property for the full chip-level system, the regulator circuit 11 is also implemented in a way such that it too is fully dynamic. This is achieved by implementing the regulator sub-blocks out of discrete-time systems, as illustrated in FIG. 5 in a generalized manner.

The regulator sub-block 20 comprises a clocked comparator 21, a charge source/sink circuitry 23, and a charge reservoir 25. The regulated output voltage 12' is monitored by the clocked comparator 21, which compares regulated output voltage 12' to the input reference voltage 12 periodically. In the case of the pipelined ADC of FIG. 3, the periodic comparison is performed once every full conversion of the ADC. The regulator sub-block 20, in an example, performs passive charge sharing operations between the charge reservoir 25 and the charge source/sink circuitry 23. Depending on the output 22 of the comparator 21, charge is either added to or subtracted from the charge reservoir 25 in a way that minimizes the difference between the external reference voltage 12 and the regulated output voltage 12'.

Normally, the achievable accuracy of the regulated output 12' is a function of a) the size of the charge reservoir 25, b) the amount of charge that the source/sink circuit 23 adds or subtracts from the reservoir 25 per update 24, c) the amount of charge (i.e., current) pulled from the regulated output 12' by the receiving circuit 13, or d) a combination thereof.

FIG. 6A-6D illustrate different embodiments for the regulator sub-block 20 along with the timing operation. In the broadest sense, the different regulator sub-blocks illustrated herein can be based on any topology or performance specification. They can formulate regulator circuits with continuous time regulation and static power consumption, or discrete time regulator circuits with dynamic power consumption and energy dissipation that scales linearly with the clock frequency, or even some hybrid or combination of both.

Figure 6A:
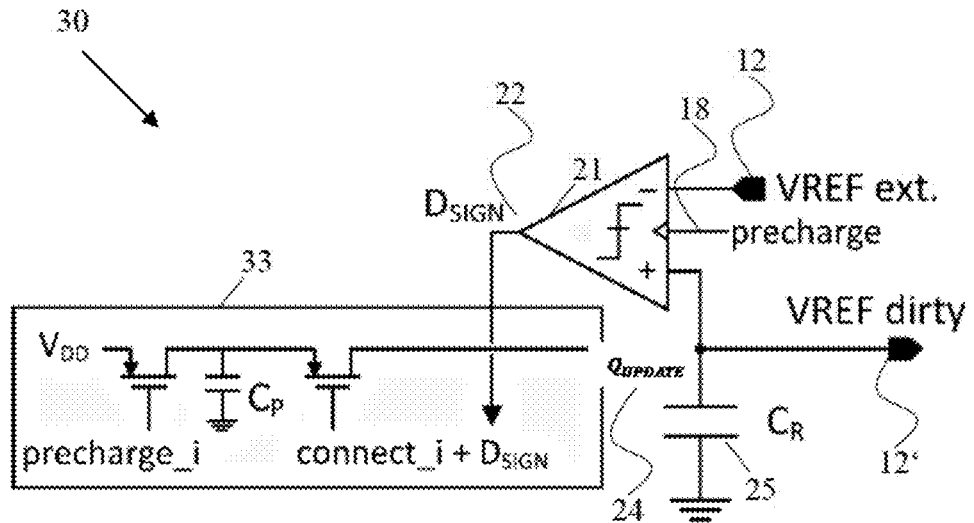
FIG. 6A illustrates a regulator block configured as a unidirectional regulator block, according to an example embodiment.

FIG. 6A illustrates a first embodiment of the regulator sub-block 30 in the form of a unidirectional regulator block. The sizing of the charge capacitor $C_P$ of the source/sink circuit 33 facilitates passive charge sharing operations between the charge reservoir 25 and the charge source/sink circuitry 33. The charge capacitor $C_P$ adds or subtracts excessive charge from the charge reservoir 25 based on the comparator's output 22, where the charging/discharging phases are controlled via a pair of PMOS switch. The switches are respectively controlled by a signal precharge_i and further by a signal (connect_i+$D_{SIGN}$), where $D_{SIGN}$ represents the output 22 of the comparator 21, and + stands for the digital OR function. The amount of charge per update 24 that is either added or subtracted from the charge reservoir 25 results in the accuracy of the regulated output voltage 12'. Herein, the regulated output voltage 12' is considered as the dirty references of the reference input signal 12, as illustrated in FIG. 4 above.

Figure 6B:
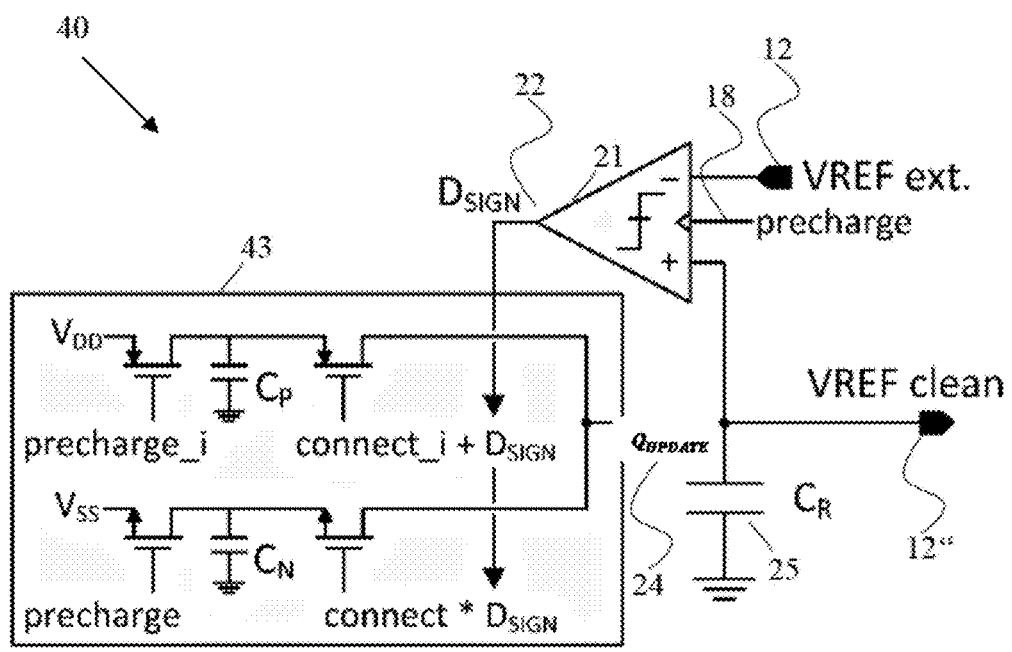
FIG. 6B illustrates a regulator block configured as a bi-directional regulator block, according to an example embodiment.

FIG. 6B illustrates a second embodiment of the regulator sub-block 40 in the form of a bi-directional regulator block. Here, the passive charging operation between the charge reservoir 25 and the charge source/sink circuitry 43 corresponds to the ratio of the charge capacitors ($C_P$, $C_N$, and $C_R$). The charging/discharging phases for each of the (dis)charge capacitors ($C_P$, and $C_N$) are respectively controlled via a pair of PMOS switches and a pair of NMOS switches. The PMOS switches are respectively controlled by a signal precharge_i and further by a signal (connect_i+$D_{SIGN}$), where $D_{SIGN}$ represents the output 22 of the comparator 21. Similarly, the NMOS switches are respectively controlled by a signal precharge and further by a signal (connect*$D_{SIGN}$), where the $D_{SIGN}$ represents the output 22 of the comparator 21, and * stands for digital AND function.

Herein, the regulated output voltage 12" is considered as the clean reference of the reference input signal 12, as illustrated in FIG. 4 above. This is obtained by sizing capacitors $C_P$ and $C_N$ to be small with respect to $C_R$, such that only small updates are made on the voltage on the charge reservoir. As a consequence, the regulator sub-block can only provide small charges to the receiving circuits, or can only vary its output slowly, such that this clean output voltage is highly accurate but has low bandwidth.

It is to be noted that, although in the above-mentioned implementation the charge source/sink circuit 43 is implemented as a passive charge-sharing operation between the charge reservoir 25 and the capacitors $C_P/C_N$, there are other possible methods for generating the charge transfer. For example, one alternative is to use a charge-pump configuration for $C_P/C_N$, which would allow for a significantly larger amount of charge to be added or subtracted to the charge reservoir 25 for a given sizing of $C_P/C_N$.

Figure 6C:
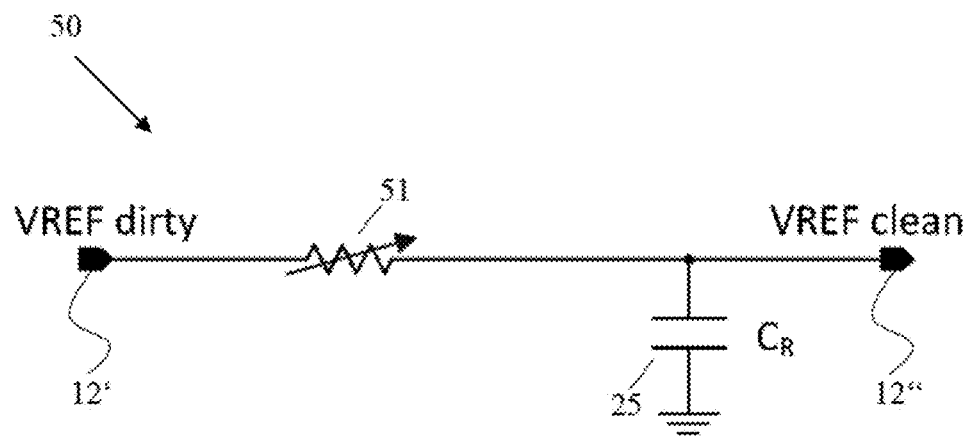
FIG. 6C illustrates a regulator block configured as a fully passive regulator block, according to an example embodiment.

FIG. 6C illustrates a third embodiment of the regulator sub-block 50 in the form of a fully passive regulator block. Due to the absence of any comparator as utilized in sub-blocks 30 and 40, the functionality of the regulator sub-block 50 is used in a way that it takes charge from one already regulated replica's output 12', for instance, from the dirty references, and delivers further regulated output 12" in the form of clean references by means of low pass filtration. In other words, the regulator sub-block 50 generates a regulated replica 12" of the input reference signal 12 with respect to any of the already generated replicas 12' instead of generating the output independently.

To perform low pass filtration, the regulator sub-block 50 comprises a resistor 51 that defines the charging and/or discharging phases of the charge reservoir 25. This resistor 51 can be a variable resistor to trade off the bandwidth and the accuracy of the regulated output 12". This resistor 51 can be implemented as a switched capacitor resistor, which has an equivalent resistance value inversely proportional to its capacitor value and its clock frequency.

Figure 6D:
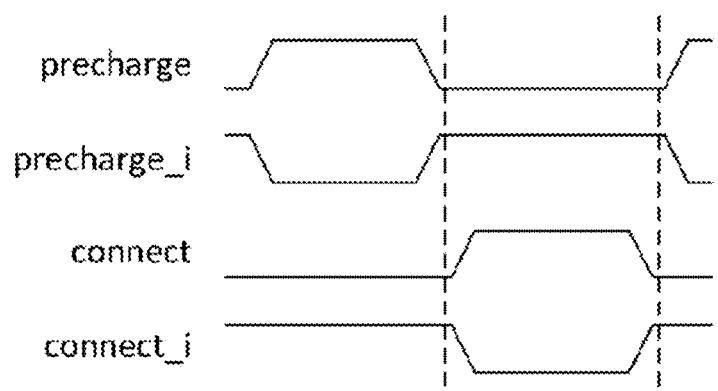
FIG. 6D illustrates a simplified timing diagram for the clock operation in the regulator blocks of FIG. 6A-6C, according to an example embodiment.

FIG. 6D illustrates a simplified timing diagram for the clock operation in the regulator blocks 30 and 40. In particular, the nature for clocks regarding the signals precharge, precharge_i, connect and connect_i are shown here with their mutual timing arrangements.

Figure 7A:
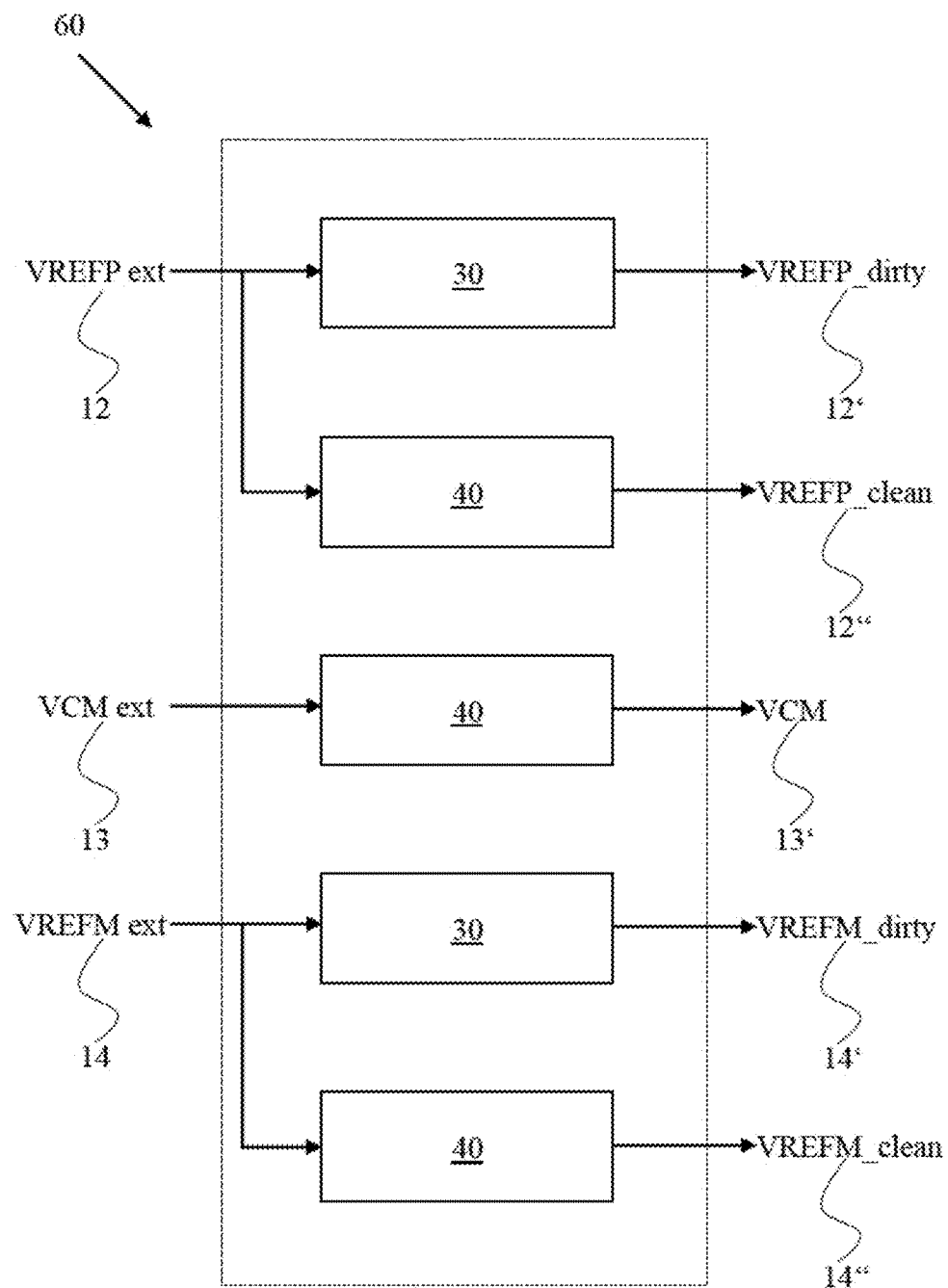
FIG. 7A illustrates a regulator circuit where multiple input reference signals are inputted, according to an example embodiment.
Figure 7B:
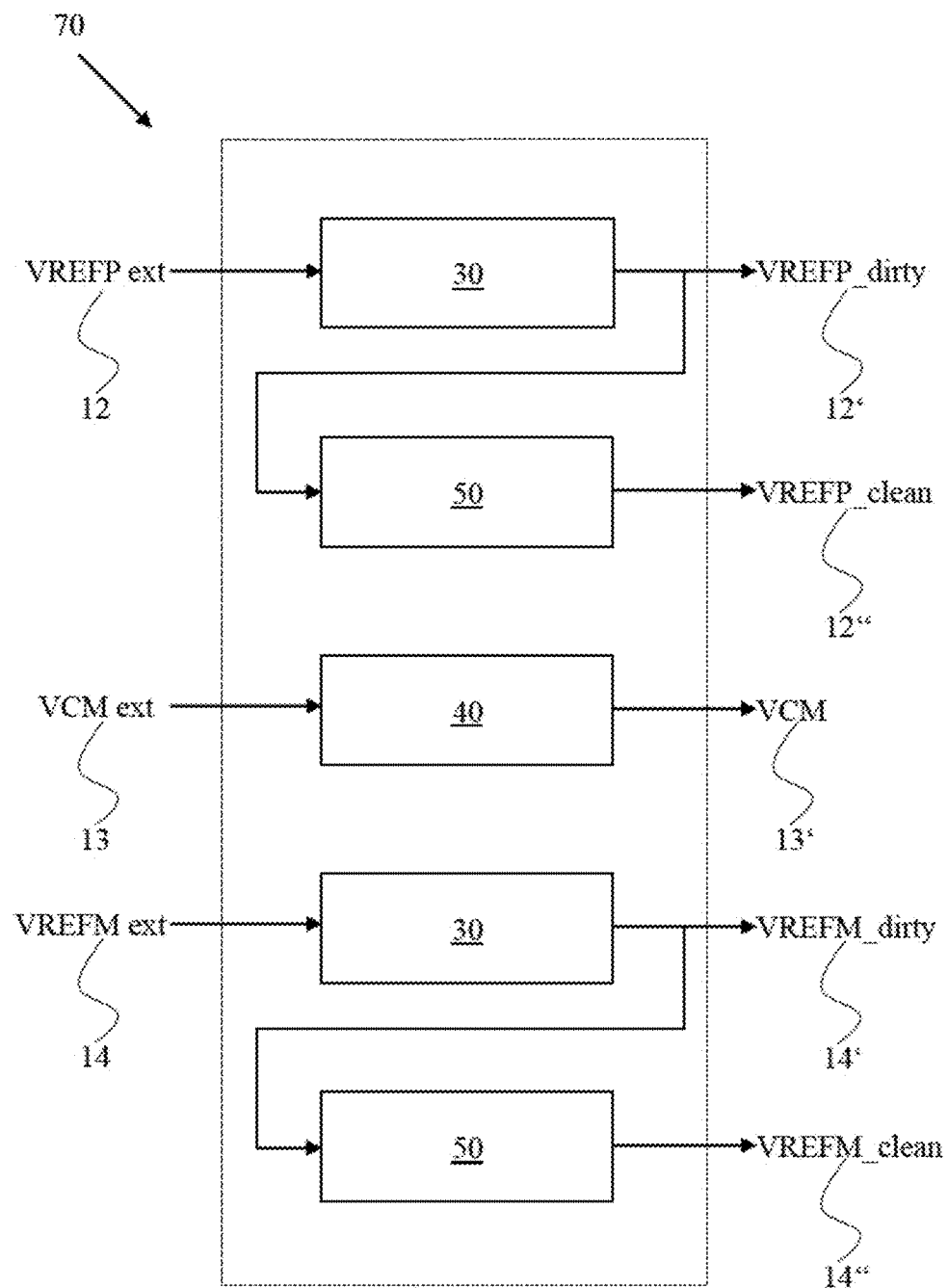
FIG. 7B illustrates an alternative to the regulator circuit, according to an example embodiment.

In FIGS. 7A and 7B, different embodiments for the regulator circuit 11 are illustrated in blocks by way of the top level reference regulator illustrated in FIG. 4 above. In particular, FIG. 7A illustrates a first embodiment of the regulator circuit 60 where multiple input reference signals are inputted. However, not every input reference signal is required to be replicated into two regulated output signals. As described in FIG. 4, the pipelined ADC requires three references: VREFP, VREFM and VCM, where only the VREFP and VREFM are needed to be regulated with regard to high accuracy requirements, since VCM has reduced accuracy requirements.

Here, the regulator circuit 60 comprises a parallel arrangement of the regulator sub-blocks (30 and 40), where the regulator sub-block 30 outputs the dirty reference 12' replicated from the reference input 12 and the regulator sub-block 40 outputs the clean reference 12" replicated from the reference input 12. For instance, as the reference VREFP is needed to be regulated with high accuracy, the regulator sub-block 30 generates the dirty reference VREFP_dirty and the regulator sub-block 40 generates the clean reference VREFP_clean. This is analogously performed for the VREFM reference.

However, since the VCM reference has reduced accuracy requirements, only the regulator sub-block 40 is utilized to generate only the clean reference for the receiving circuit 13. As a result, the top-level reference regulator 60 illustrated herein is able to handle multiple input reference signals (12, 13, and 14), and in some examples, multiple simultaneous reference inputs and generates regulated replicas independently as per the requirement of the receiving circuit 13, e.g., accuracy. It is also explicit that the number of input reference signals can be extended and can be effectively handled by the regulator circuit 11 by incorporating additional respective regulator sub-blocks (30 and 40).

FIG. 7B illustrates a second embodiment of the regulator circuit 70 by way of the top-level reference regulator. The regulator circuit 70 differs from the regulator circuit 60 of FIG. 7A in that the regulator circuit 70 comprises the regulator sub-block 50 instead of the regulator sub-block 40 particularly for generating regulated replicas of the reference signal. Thus, for the references VREFP resp., VREFM, the regulator sub-block 30 is used for the dirty references and the regulator sub-block 50 is used for the clean references.

This arrangement of the regulator sub-blocks (30 and 50) is limited to the operations where the frequency content of the current pulled from the dirty regulated output is primarily at relatively higher frequencies. This means that the error of that output is also high-frequency in nature. By low pass filtering the output via the regulator sub-block 50, this error can be removed, and can be provided as a second replica output (i.e., the clean reference) that will have higher accuracy and lower error.

Moreover, the amount of low pass filtering possible (i.e., error suppression) is further limited by the amount of DC current that must be provided to the receiving circuit 13 by the clean reference. As mentioned before, it is often the case that the current drawn from the clean reference by the receiving circuit 13 is significantly less than the current drawn from the dirty reference by the receiving circuit 13, and so this arrangement can be effectively utilized for the regulator circuit 11. If, however, this is not the case, then active regulation may be necessary for the clean references as implemented in the regulator circuit 60 of FIG. 7A.

Figure 8:
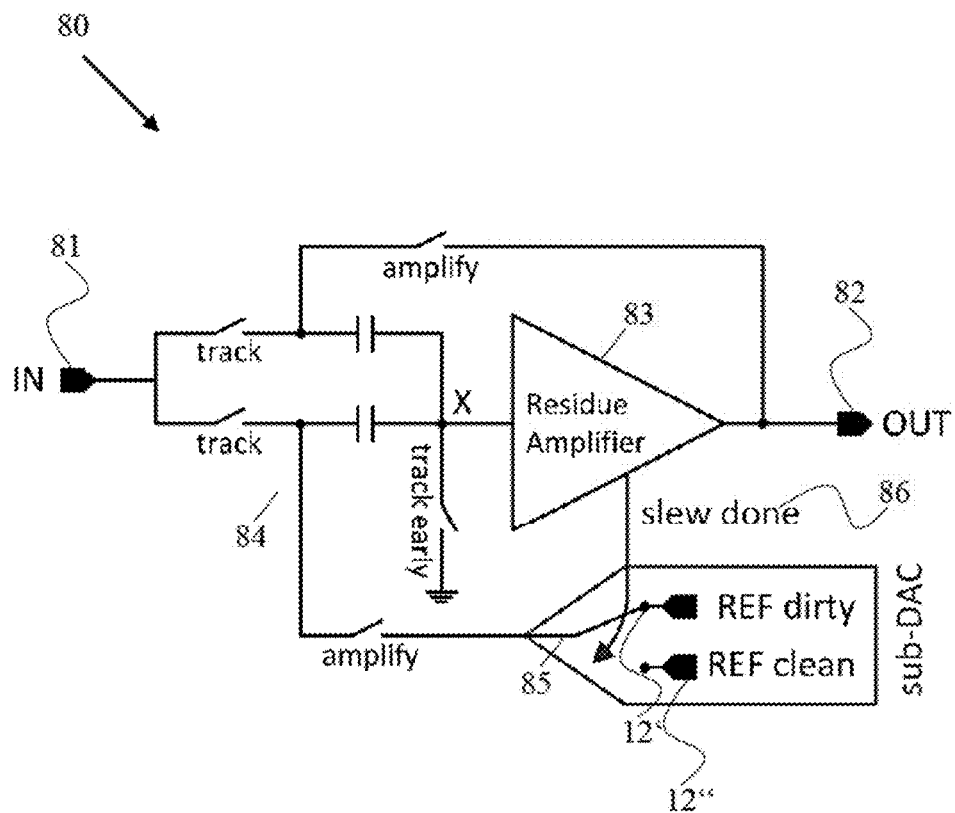
FIG. 8 illustrates a receiving circuit implementation, according to an example embodiment.

FIG. 8 illustrates a first embodiment for the receiving circuit 80. In particular, the implemented receiving circuit 80 corresponds to the 1.5b-flip-around MDAC circuit implemented as a part of each stage of the pipelined ADC, as illustrated in FIG. 4. However, in the broadest sense, there is no restriction to what the receiving circuit 80 can be. In the most direct applications, the receiving circuit 80 is a discrete-time switched-capacitor signal processing circuit, which covers a broad scope of circuit and applications. As an embodiment illustrated herein, the receiving circuit 80 is realized in the context of a MDAC circuit, that can be used for, but not limited to, pipelined ADCs.

An example of the receiving circuit 80 is implemented in cascade along with the preceding and following stages through the input signal line 81 and output signal line 82. The receiving circuit 80 comprises a switched-capacitor arrangement 84 followed by a residue amplifier 83 to settle the output to a certain solution. The receiving circuit 80 further comprises a switching circuit 85 that allows the receiving circuit 80 to switch from one regulated replica 12' to another regulated replica 12". Hence, the conventional MDAC circuit has been modified to be able to switch between the multiple regulated replicas (12' and 12'). The switching criteria is defined via a slew-done signal 86 generated by a detector circuit (not shown).

Figure 9:
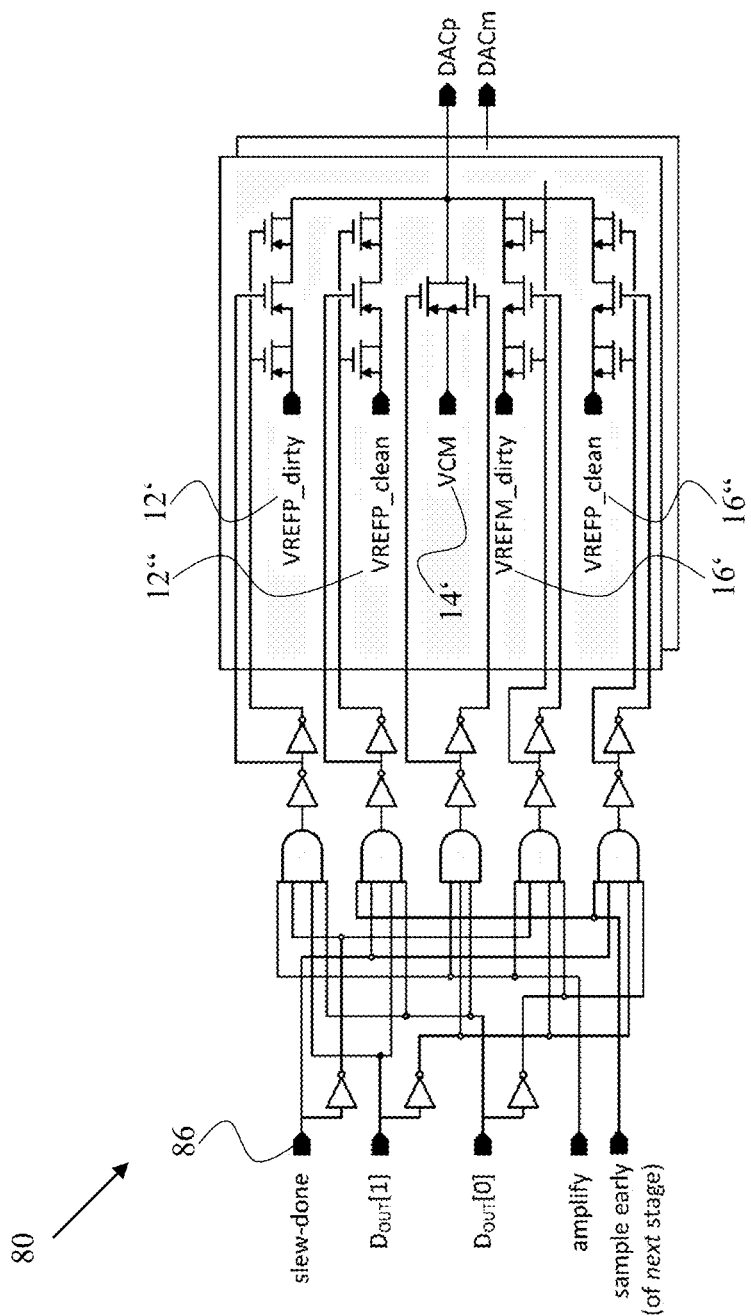
FIG. 9 illustrates a detailed view of the receiving circuit implementation of FIG. 7, according to an example embodiment.

FIG. 9 illustrates a detailed view of the receiving circuit 80, an in particular for the specific case of the 1.5b-flip-around MDAC. The receiving circuit 80 is configured to switch from the dirty references (12' and 16') to the clean references (12" and 16") when the slew-done input signal 86 asserts. In is further comprehensible that the switching is done in a non-overlapping manner so that no charge can transfer directly from one reference to the other. In an example, dummy switches are also included at the outputs to cancel charge injection and clock feedthrough, which minimizes the size of the glitch that happens in the MDAC when the switch-over occurs.

Figure 10A:
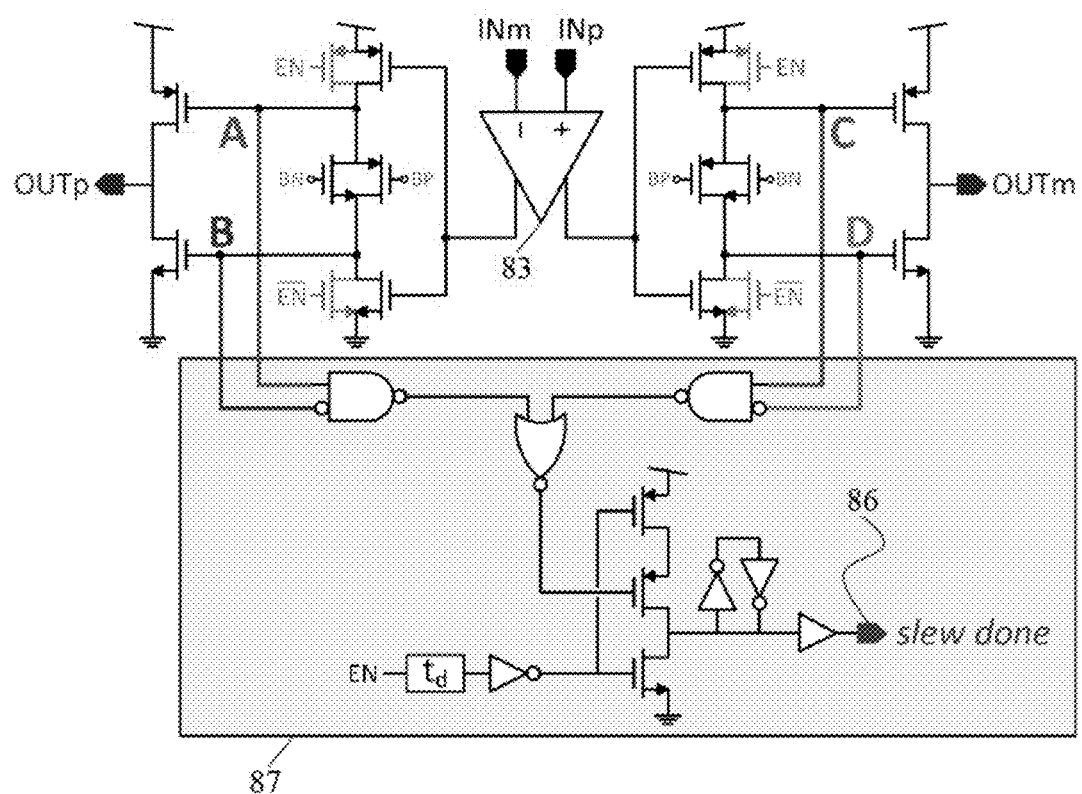
FIG. 10A illustrates an implementation of a slew-done detector circuit, according to an example embodiment.
Figure 10B:
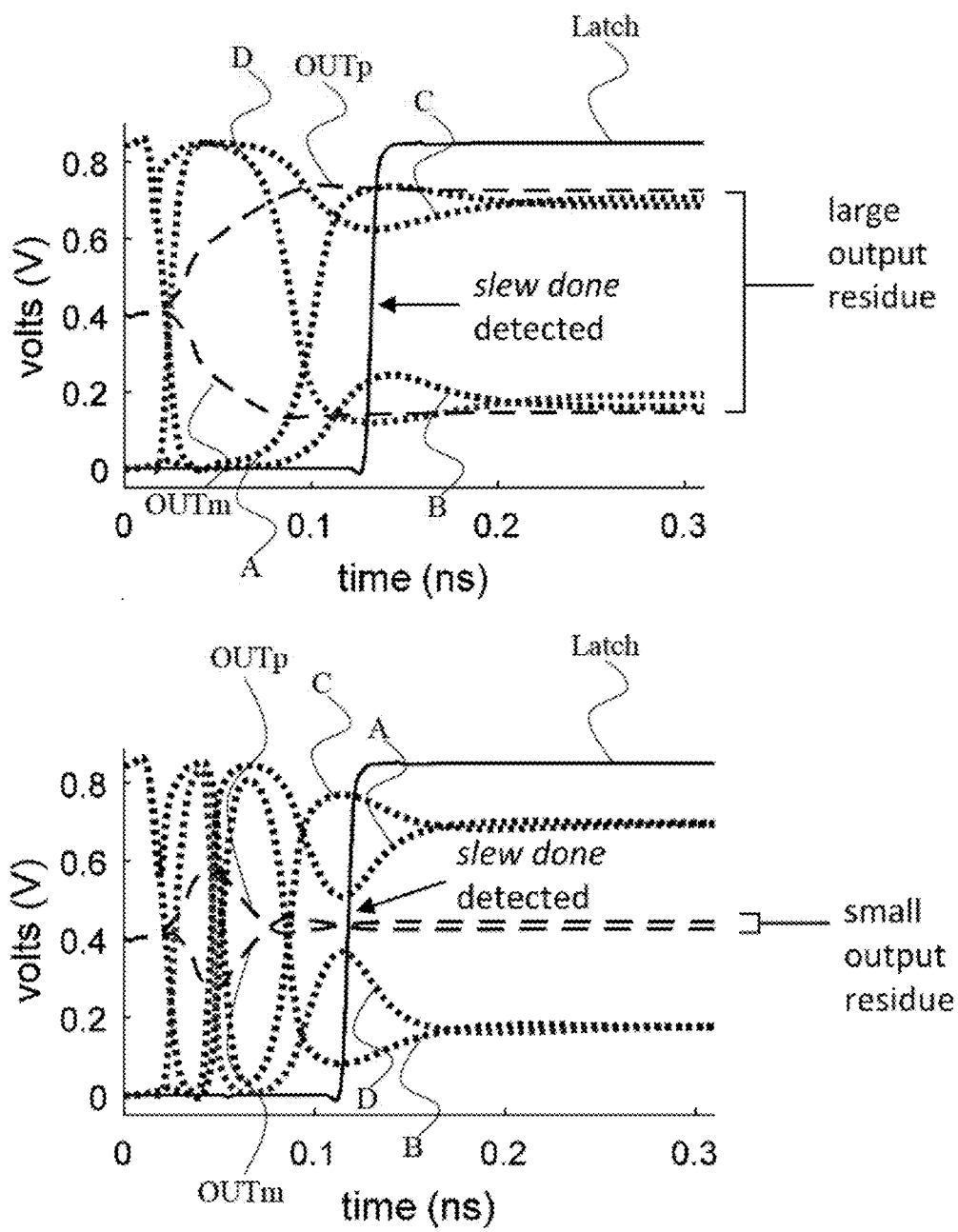
FIG. 10B graphically illustrates the operation of the circuit of FIG. 9, according to an example embodiment.

FIGS. 10A and 10B illustrate the implementation and operation of a detector or a so-called slew-done detector 87. In particular, FIG. 10A illustrates an example implementation of the slew-done detector 87. The implementation illustrated herein is based on the MDAC circuit of FIG. 8 and FIG. 9, where a ring amplifier is used as the residue amplifier 83. The detector operates based on the principle that only after slewing has finished will the binary quantized logic equation AB'CD' evaluate to "1". In FIG. 10B, the transient waveform operation of this principle is shown. This slew-done signal 86 can then be fed to the receiving circuit 80, i.e., the MDAC circuit, to initiate the switching from dirty to clean reference.

Since the vast majority of charge pulled from the references occurs during slewing, as illustrated in FIG. 10B, switching at this moment ensures that only a small fraction of the total charge pull will be taken from the high-accuracy clean reference (12" and 14"). Meanwhile, the accuracy of the reference when slewing does not need to be high, but the accuracy of the reference after slewing (i.e., settling) does need to be high. This orthogonal operation further supports that it is often the case that when a circuit needs low output impedance from the reference, it does not need high accuracy, and that when it needs high accuracy, it does not need low output impedance.

Figure 11:
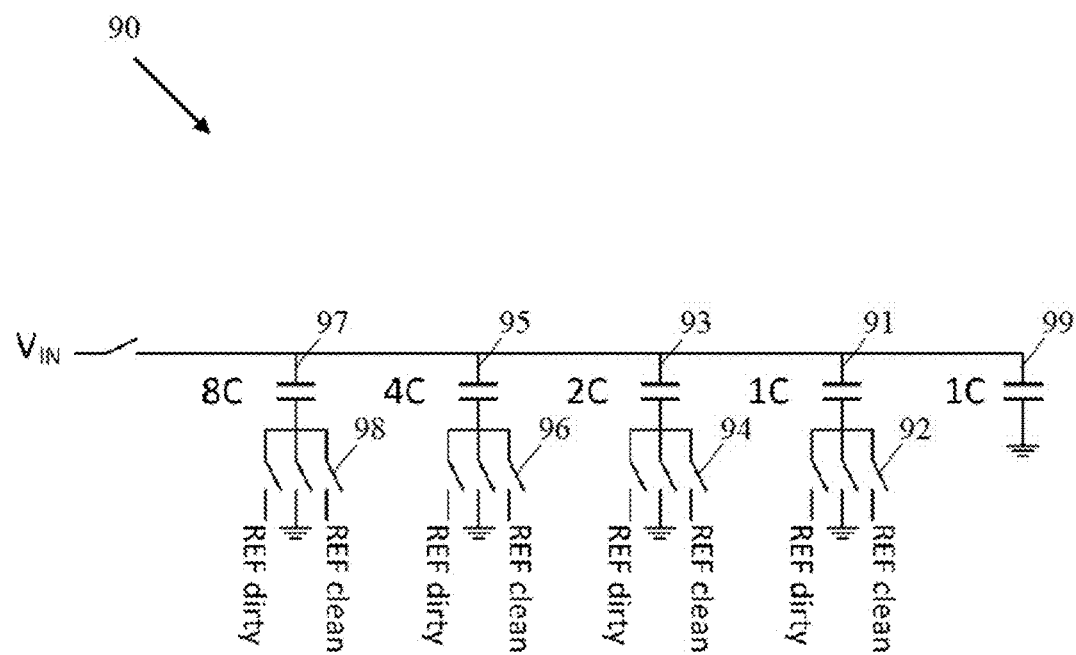
FIG. 11 illustrates a receiving circuit implementation, according to an example embodiment.

FIG. 11 illustrates a second embodiment for the receiving circuit 90. In particular, the receiving circuit 90 has been implemented by means of a switched-capacitor charge-redistribution DAC, as is used in SAR ADCs. The receiving circuit 90 resembles a top-plate-sampled 4 bit DAC with cascaded four weighted stages (91, 93, 95, and 97) and further a reference node 99. Instead of just switching between the minimum set of voltage inputs (i.e., the dirty reference and ground) as performed conventionally, it is possible to add additional switching (92, 94, 96, and 98) and respective voltage inputs.

One possible consideration can be based on the assumption that the DAC 90 is used in a feedback loop with a comparator to operate as a SAR ADC. Further assumption can be made that some amount of redundancy is built into the SAR algorithm, either by extra comparison steps or any other method of redundancy. Due to the redundancy, the overall accuracy of the reference when resolving the MSBs 97 is significantly less than the accuracy required when resolving the final LSBs 91.

Meanwhile, the vast majority of charge will be taken from the reference by the MSBs 97, while only a small remainder will be pulled by the LSBs 91. Thus, it can be seen that orthogonality of accuracy of the reference versus required output impedance of the reference can be achieved in the receiving circuit 90. Therefore, the MSBs 97 can be switched using the REF dirty connection, and at the LSBs 91 all capacitors connected to REF dirty can be switched over to REF clean instead, and the final LSBs 91 can be resolved using the high accuracy reference.

As an alternative to the foregoing example, the limit-case of the example can be considered, where the most or all of the conversion is performed using the dirty reference, and only at or after the final search step are the capacitors connected to REF dirty switched over to REF clean instead. This way, only a very small error charge must be sourced by the clean reference, relaxing its regulator's design ever further. Although this alternative does not allow for correction of errors based on redundancy, in many applications it may still be useful.

For example, in the case of a pipelined-SAR ADC, the error-correction redundancy is often built into the inter-stage gain. As a result, the first stage SAR ADC's conversion accuracy requirement is much less than the accuracy requirement for its residue that will be passed on to the next stage. For example, in a 10b pipelined-SAR with a 5b SAR in the first stage, the SAR itself only needs to be 5b accurate, but the 5b DAC's residue must be at least 10b accurate. In this sort of scenario, the described operation can be very useful. The vast majority of the charge still comes from the dirty reference, but the full accuracy of the clean reference determines the final DAC residue accuracy.

Figure 12:
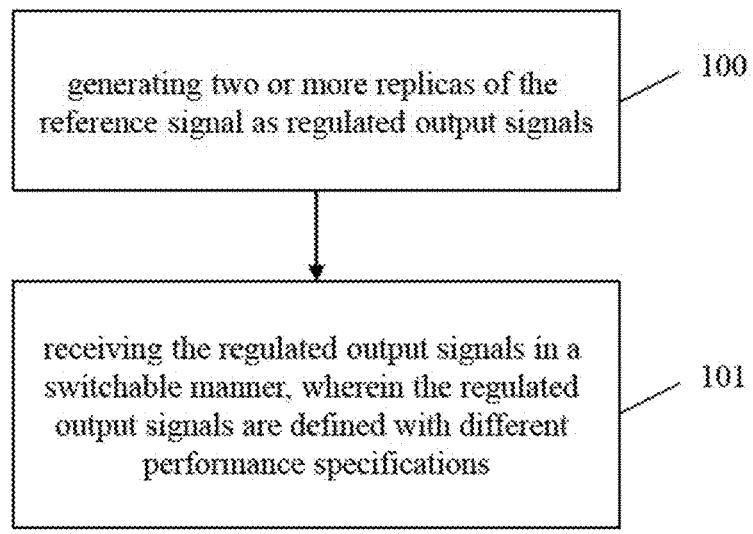
FIG. 12 illustrates a method performed by a device for buffering a reference signal, according to an example embodiment.

FIG. 12 illustrates an embodiment of the method according to the second aspect. In a first step 100, two or more replicas of the reference signal are generated as regulated output signals. In a second step 101, the regulated output signals are received in a switchable manner, wherein the regulated output signals are configured to have different performance characteristics.

The embodiments disclosed herein can be implemented by hardware, software, or any combination thereof. Various embodiments of may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A device for buffering a reference signal comprising:
    a regulator circuit having an input configured to be in electrical communication with the reference signal and having at least two outputs, wherein the regulator circuit is configured to generate at least two replicas of the reference signal as regulated output signals and to respectively output the at least two replicas of the reference signal via the at least two outputs; and
    a receiving circuit having at least two inputs in electrical communication with the at least two outputs of the regulator circuit, a switch circuit configured to electrically couple one of the at least two inputs to further circuitry of the receiving circuit, and a detector circuit configured to provide control signals to the switching circuit to control the switching circuit to switch from one regulated output signal to another regulated output signal at a time at which a desired performance characteristic of the regulated output signal changes,
    wherein the detector circuit is further configured to output a slew-done signal to indicate that the receiving circuit should stop slewing and commence settling behavior and wherein in response to the slew-done signal, the switching circuit switches from one regulated output signal to another regulated output signal, and
    wherein the regulated output signals are configured to have with different performance characteristics.

2. The device according to claim 1, wherein the regulator circuit comprises a plurality of regulator sub-blocks, wherein each sub-block is configured to generate a respective regulated output signal.

3. The device according to claim 2, wherein the plurality of regulator sub-blocks are further configured to generate the regulated output signals independently.

4. The device according to claim 2,
    wherein each regulator sub-block comprises a clocked comparator, a charge reservoir, and a charge source/sink circuitry, wherein the clocked comparator is configured to compare the regulated output signal to the reference signal, and the regulator sub-block is further configured to perform charge sharing operation between the charge reservoir and the charge source/sink circuitry.

5. The device according to claim 4, wherein the regulator sub-block further comprises a variable resistor configured to define one or both of: charging and discharging of the charge reservoir.

6. The device according to claim 5, wherein the regulator circuit is further configured to receive a plurality of reference signals and wherein the regulator circuit is configured to generate at least two replicas of all or some of the reference signals as regulated output signals.

7. The device according to claim 6, wherein the switching circuit is configured to switch from one regulated output signal to another regulated output signal in a non-overlapping manner.

8. A device for buffering a reference signal comprising:
a regulator circuit having an input configured to be in electrical communication with the reference signal and having at least two outputs, wherein the regulator circuit is configured to generate at least two replicas of the reference signal as regulated output signals and to respectively output the at least two replicas of the reference signal via the at least two outputs and wherein the regulator circuit comprises a plurality of regulator sub-blocks, wherein each regulator sub-block is configured to generate a respective regulated output signal; and
wherein each regulator sub-block comprises a clocked comparator, a charge reservoir, a charge source/sink circuitry and a variable resistor, wherein the clocked comparator is configured to compare the regulated output signal to the reference signal, and the regulator sub-block is further configured to perform charge sharing operation between the charge reservoir and the charge source/sink circuitry, and wherein the variable resistor is configured to define one or both of: charging and discharging of the charge reservoir;
wherein the regulator circuit is further configured to receive a plurality of reference signals and wherein the regulator circuit is configured to generate at least two replicas of all or some of the reference signals as regulated output signals;
a receiving circuit having at least two inputs in electrical communication with the at least two outputs of the regulator circuit and a switch circuit configured to electrically couple one of the at least two inputs to further circuitry of the receiving circuit wherein the switching circuit is configured to switch from one regulated output signal to another regulated output signal in a non-overlapping manner,
wherein the receiving circuit further comprises a detector circuit configured to provide control signals to the switching circuit to control the switching circuit to switch from one regulated output signal to another regulated output signal at a time at which a desired performance characteristic of the regulated output signal changes, and wherein the detector circuit is further configured to sense a delayed version of a trigger signal at which the receiving circuit starts operation; and
wherein the regulated output signals are configured to have with different performance characteristics.

9. The device according to claim 8, wherein the receiving circuit is a discrete-time switched-capacitor signal processing circuit and wherein the regulator circuit is configured as a reference regulator for the signal processing circuit.

10. The device according to claim 9, wherein one of the at least two replicas of the reference signal is configured as a high speed, low accuracy reference signal thereby generating a first regulated output signal and wherein the other reference signal is configured as a low speed, high accuracy reference signal thereby generating a second regulated output signal, and
wherein the receiving circuit is configured to utilize the first regulated output signal and the second regulated output signal successively.

11. The device according to claim 1, wherein the regulator circuit is further configured to receive a plurality of reference signals and wherein the regulator circuit is configured to generate at least two replicas of all or some of the reference signals as regulated output signals.

12. The device according to claim 1, wherein the switching circuit configured to switch from one regulated output signal to another regulated output signal in a non-overlapping manner.

13. The device according to claim 1, wherein the receiving circuit is a discrete-time switched-capacitor signal processing circuit and wherein the regulator circuit is configured as a reference regulator for the signal processing circuit.

14. The device according to claim 1, wherein one of the at least two replicas of the reference signal is configured as a high speed, low accuracy reference signal thereby generating a first regulated output signal and wherein the other reference signal is configured as a low speed, high accuracy reference signal thereby generating a second regulated output signal, and
wherein the receiving circuit is configured to utilize the first regulated output signal and the second regulated output signal successively.

* * * * *